US010861838B2

(12) United States Patent
Iwafuchi et al.

(10) Patent No.: US 10,861,838 B2
(45) Date of Patent: Dec. 8, 2020

(54) OPTICAL MODULE

(71) Applicant: SONY CORPORATION, Tokyo (JP)

(72) Inventors: Toshiaki Iwafuchi, Kanagawa (JP);
Takayuki Ezaki, Kanagawa (JP);
Tomoshi Oode, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/242,831

(22) Filed: Jan. 8, 2019

(65) Prior Publication Data

US 2019/0148350 A1 May 16, 2019

Related U.S. Application Data

(63) Continuation of application No. 15/414,914, filed on Jan. 25, 2017, now Pat. No. 10,211,192, which is a
(Continued)

(30) Foreign Application Priority Data

Apr. 27, 2012 (JP) .................................. 2012-103133

(51) Int. Cl.
H01L 25/18 (2006.01)
H04N 5/225 (2006.01)
(Continued)

(52) U.S. Cl.
CPC .............. *H01L 25/18* (2013.01); *H01L 24/49* (2013.01); *H01L 27/14618* (2013.01);
(Continued)

(58) Field of Classification Search
None
See application file for complete search history.

(56) References Cited

U.S. PATENT DOCUMENTS

2005/0012024 A1  1/2005 Hsieh et al.
2005/0258518 A1  11/2005 Yang et al.
(Continued)

FOREIGN PATENT DOCUMENTS

CN  1591884 A  3/2005
CN  1787092 A  6/2006
(Continued)

OTHER PUBLICATIONS

Office Action for KR Patent Application No. 10-2014-7028389, dated Jun. 17, 2019, 05 pages of Office Action and 04 pages of English Translation.
(Continued)

*Primary Examiner* — Khaja Ahmad
(74) *Attorney, Agent, or Firm* — Chip Law Group

(57) ABSTRACT

The present optical module includes a sensor configured to pick up an image of an image pickup object, and a memory chip configured to store pixel data read out from the sensor and having the sensor joined thereto. The memory chip is connected to a substrate by a connection portion by flip-chip connection. The sensor can be connected by a wire to the memory chip, to which the sensor is joined. Further, the sensor can be joined to the memory chip in such a manner as to project toward an opening of the substrate. The present technology can be applied to a camera module.

13 Claims, 16 Drawing Sheets

Related U.S. Application Data continuation of application No. 14/394,197, filed as application No. PCT/JP2013/002579 on Apr. 16, 2013, now Pat. No. 9,607,972.

(51) Int. Cl.
*H01L 27/146* (2006.01)
*H01L 23/00* (2006.01)

(52) U.S. Cl.
CPC .. *H01L 27/14621* (2013.01); *H01L 27/14625* (2013.01); *H01L 27/14634* (2013.01); *H01L 27/14636* (2013.01); *H04N 5/2253* (2013.01); *H04N 5/2254* (2013.01); *H04N 5/2257* (2013.01); *H01L 24/45* (2013.01); *H01L 24/48* (2013.01); *H01L 2224/32145* (2013.01); *H01L 2224/45144* (2013.01); *H01L 2224/48091* (2013.01); *H01L 2224/48145* (2013.01); *H01L 2224/49* (2013.01); *H01L 2224/73265* (2013.01); *H01L 2924/00014* (2013.01); *H01L 2924/1434* (2013.01); *H01L 2924/15787* (2013.01)

(56) References Cited

U.S. PATENT DOCUMENTS

| | | | |
|---|---|---|---|
| 2006/0016973 A1* | 1/2006 | Yang | H01L 31/0203 250/239 |
| 2006/0022290 A1 | 2/2006 | Chen et al. | |
| 2006/0091487 A1 | 5/2006 | Hanada et al. | |
| 2006/0181633 A1* | 8/2006 | Seo | H04N 5/2253 348/340 |
| 2006/0199307 A1 | 9/2006 | Tsai et al. | |
| 2006/0219862 A1 | 10/2006 | Ho et al. | |
| 2006/0261446 A1 | 11/2006 | Wood et al. | |
| 2006/0261458 A1 | 11/2006 | Paek et al. | |
| 2006/0267169 A1* | 11/2006 | Bolken | H01L 23/293 257/678 |
| 2006/0284299 A1 | 12/2006 | Karnezos | |
| 2007/0190687 A1 | 8/2007 | Chen et al. | |
| 2008/0048097 A1 | 2/2008 | Chen et al. | |
| 2008/0220563 A1 | 9/2008 | Karnezos | |
| 2008/0267616 A1* | 10/2008 | Kinoshita | G02B 7/02 396/518 |
| 2008/0308928 A1 | 12/2008 | Chang et al. | |
| 2008/0309810 A1 | 12/2008 | Smith et al. | |
| 2009/0033790 A1 | 2/2009 | Lin | |
| 2009/0109327 A1* | 4/2009 | Chen | G02B 7/02 348/374 |
| 2009/0110325 A1* | 4/2009 | Smith | G06K 7/10762 382/275 |
| 2010/0165183 A1 | 7/2010 | Tian | |
| 2010/0259657 A1 | 10/2010 | Lee et al. | |
| 2010/0328525 A1 | 12/2010 | Lee et al. | |
| 2012/0281113 A1 | 11/2012 | Kennedy et al. | |
| 2012/0301124 A1* | 11/2012 | Wang | H01L 27/14609 396/14 |
| 2013/0050571 A1* | 2/2013 | Tam | H01L 27/14618 348/374 |

FOREIGN PATENT DOCUMENTS

| | | |
|---|---|---|
| CN | 101170645 A | 4/2008 |
| CN | 101715644 A | 5/2010 |
| GB | 2463222 A | 3/2010 |
| JP | 2001-016486 A | 1/2001 |
| JP | 2005-072978 A | 3/2005 |
| JP | 4416760 B2 | 2/2010 |
| KR | 10-2006-0133496 A | 12/2006 |
| TW | 200849982 A | 12/2008 |
| TW | 200908698 A | 2/2009 |
| TW | 201029147 A | 8/2010 |
| TW | I331392 A | 10/2010 |
| WO | 2008/157150 A2 | 12/2008 |

OTHER PUBLICATIONS

Kurino, et al., "Intelligent Image Sensor Chip with Three Dimensional Structure", Electron Devices Meeting 1999, IEDM Technical Digest, Dec. 5, 1999, pp. 879-882.

International Search Report and Written Opinion of PCT Application No. PCT/JP2013/002579, dated Jul. 25, 2013, 11 pages of ISRWO.

Notice of Allowance and Fees Due for U.S. Appl. No. 14/394,197, dated Nov. 18, 2016, 09 pages.

Advisory Action for U.S. Appl. No. 14/394,197, dated Oct. 3, 2016, 03 pages.

Final Rejection for U.S. Appl. No. 14/394,197, dated Jul. 22, 2016, 15 pages.

Non-Final Rejection for U.S. Appl. No. 14/394,197, dated Apr. 14, 2016, 10 pages.

Advisory Action for U.S. Appl. No. 14/394,197, dated Feb. 22, 2016, 03 pages.

Final Rejection for U.S. Appl. No. 14/394,197, dated Dec. 11, 2015, 11 pages.

Non-Final Rejection for U.S. Appl. No. 14/394,197, dated Aug. 21, 2015, 08 pages.

Notice of Allowance and Fees Due for U.S. Appl. No. 15/414,914, dated Oct. 3, 2018, 08 pages.

Non-Final Rejection for U.S. Appl. No. 15/414,914, dated Apr. 26, 2018, 18 pages.

Advisory Action for U.S. Appl. No. 15/414,914, dated Feb. 1, 2018, 03 pages.

Final Rejection for U.S. Appl. No. 15/414,914, dated Nov. 27, 2017, 16 pages.

Non-Final Rejection for U.S. Appl. No. 15/414,914, dated Jun. 29, 2017, 14 pages.

International Preliminary Report on Patentability of PCT Application No. PCT/JP2013/002579, dated Oct. 28, 2014, 08 pages of IPRP.

Office Action for CN Patent Application No. 201711224856.7, dated Oct. 9, 2019, 08 pages of Office Action and 08 pages of English Translation.

* cited by examiner

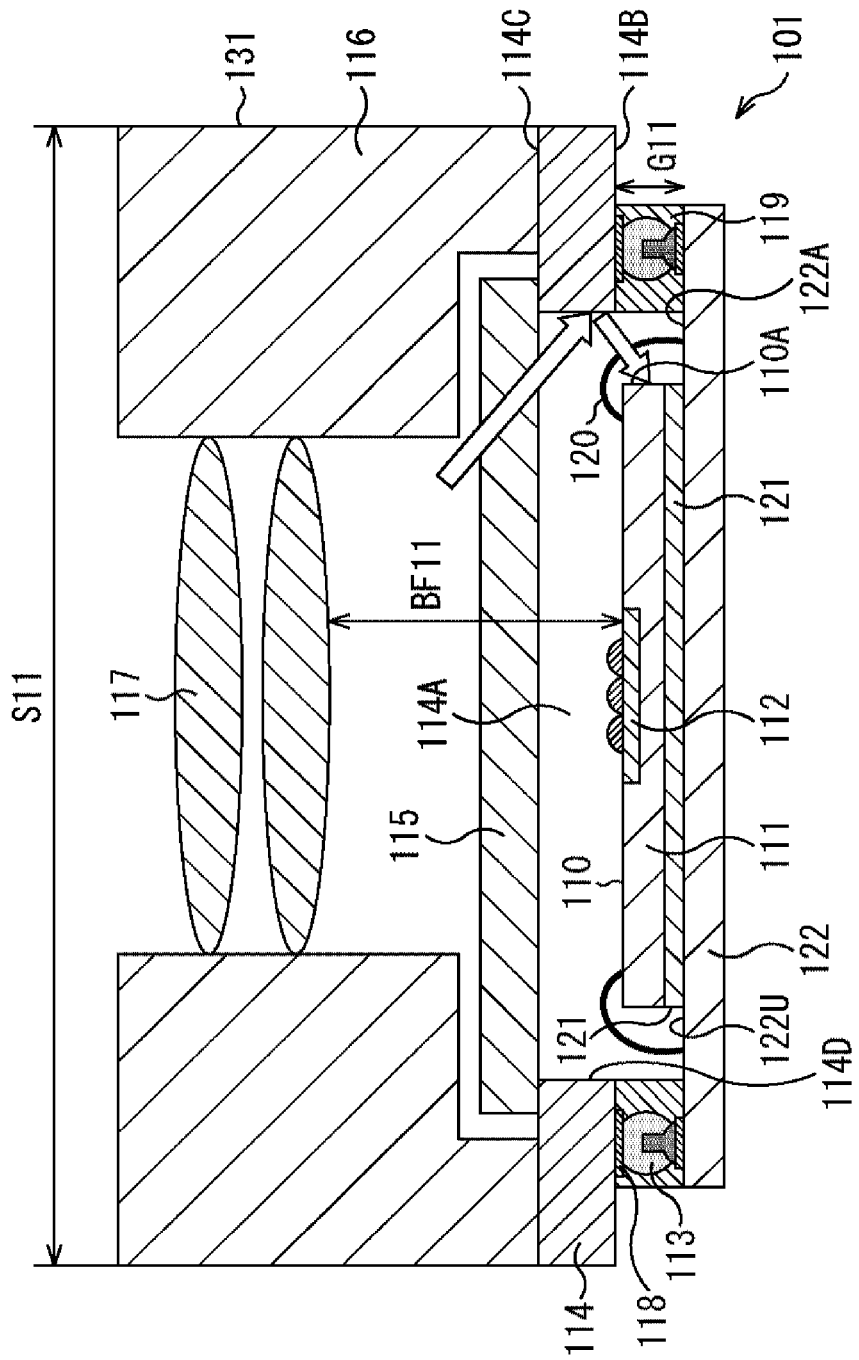

OPTICAL MODULE

CROSS-REFERENCE PARAGRAPH

The present application is a continuation application of U.S. patent application Ser. No. 15/414,914, filed Jan. 25, 2017, which is a continuation application of U.S. patent application Ser. No. 14/394,197, filed Oct. 14, 2014, now U.S. Pat. No. 9,607,972, which is a National Stage of PCT/JP2013/002579, filed Apr. 16, 2013, and claims the benefit of priority from prior Japanese Patent Application JP 2012-103133, filed in the Japan Patent Office on Apr. 27, 2012, the entire content of which is hereby incorporated by reference. Each of the above-referenced applications is hereby incorporated herein by reference in its entirety.

TECHNICAL FIELD

The present technique relates to an optical module, and particularly to an optical module which suppresses appearance of a ghost.

BACKGROUND ART

Recently, further downsizing of an optical module represented by a camera module to be incorporated in a portable telephone set, a smartphone or the like is attempted. FIG. 1 is a view showing a principle configuration of a cross section of such a conventional optical module 1 as just described.

In the optical module 1 shown in FIG. 1, a sensor 10 is configured from a logic section 11 and a light reception section 12. A circuit for processing pixel data outputted from the light reception section 12 is formed in the logic section 11. It is to be noted that a protrusion shown on the surface of the light reception section 12 represents a pixel, and, while only three protrusions are shown in FIG. 1 for simplified illustration, actually a great number of pixels are formed.

The sensor 10 is flip-chip (Flip Chip) connected at a periphery thereof to a substrate 14 by bumps 13. An opening 14A of the substrate 14 is closed up with an infrared cut filter (IRCF) 15. Further, a retention member 16 for retaining a lens 17 is joined to the substrate 14.

By the configuration described above, light from an image pickup object enters the light reception section 12 through the lens 17 and the infrared ray cut filter 15. Pixel data generated by the pixels of the light reception section 12 is processed by the circuit of the logic section 11 and outputted to the outside.

Since the sensor 10 is flip-chip connected, reduction in size thereof can be anticipated in comparison with an alternative case wherein the sensor 10 is wire-bonded.

CITATION LIST

Patent Literature

PTL1
JP 2001-16486A

SUMMARY

Technical Problem

Here, a ghost image is described. FIG. 2 illustrates a state of reflection of light of the optical module 1 of FIG. 1. It is to be noted that, as shown in FIG. 2, part of the light entering through the lens 17 and the filter 15 (refer to FIG. 1) is reflected by an end face 14D of the substrate 14. Part of the reflected light advances toward the sensor 10 and is received by the light reception section 12. In this manner, while only light passing through the lens 17 and the filter 15 originally is to directly enter the light reception section 12, if the reflected light enters, then noise components enter and abnormality of an image called ghost is likely to appear.

The present technology has been made in view of such a situation as described above, and it is an object of the present technology to suppress appearance of a ghost.

Solution to Problem

According to an aspect of the present technology, there is provided an optical module including a sensor configured to pick up an image of an image pickup object, and a memory chip configured to store pixel data read out from the sensor and having the sensor joined thereto, and wherein the chip sizes of the memory chip and the sensor are different from each other and the sensor is placed at an upper portion of the memory chip.

The memory chip may be connected to a substrate through a connection portion by flip-chip connection.

The sensor may be connected by a wire to the memory chip to which the sensor is joined.

The sensor may be joined to the memory chip so as to project toward an opening of the substrate from the memory chip.

The connection portion by the flip-chip connection may connect a periphery of the memory chip to the substrate.

The wire may be connected at one end thereof to a periphery of a face of the sensor on the opening side and at the other end thereof to a region of the memory chip between the connection portion by the flip-chip connection and an end face of the sensor.

The sensor may be a stacked sensor.

A retention member which retains a lens for guiding light emerging toward a filter so as to enter the sensor through the filter may be joined to a face of the substrate opposing to the face of the memory chip to which the connection portion by the flip-chip connection is connected.

The memory chip may be joined at a face thereof, on which the sensor is not placed, to the substrate.

A retention member which retains a lens for guiding light emerging toward a filter so as to enter the sensor through the filter may be joined to the face of the substrate to which the memory chip is joined.

The memory chip may be connected, at the face thereof, to which the sensor is joined, to the substrate by a wire.

In the aspect of the present technology, an optical module including a sensor configured to pick up an image of an image pickup object, and a memory chip configured to store pixel data read out from the sensor and having the sensor joined thereto, and the chip sizes of the memory chip and the sensor are different from each other and the sensor is placed at an upper portion of the memory chip.

ADVANTAGEOUS EFFECT OF INVENTION

As described above, with the aspect of the present technology, appearance of a ghost can be suppressed.

BRIEF DESCRIPTION OF DRAWINGS

FIG. 8 is a view illustrating a state of reflection of light of the optical module 101 of FIG. 3.

DESCRIPTION OF EMBODIMENTS

In the following, modes (hereinafter referred to as embodiments) for carrying out the present technology are described. It is to be noted that description is given in the following order.

1. First Embodiment (case wherein a non-stacked sensor is used)
[Structure of the Optical Module]
[Configuration of the Fabrication Apparatus]
[Fabrication Process]
2. Second Embodiment (case wherein a stacked sensor is used)
[Structure of the Optical Module]
[Fabrication Process]
[Modification]
[Fabrication Process]
3. [Other Configuration]

1. First Embodiment (Case Wherein a Non-Stacked Sensor is Used)

Structure of the Optical Module

Figure 3:
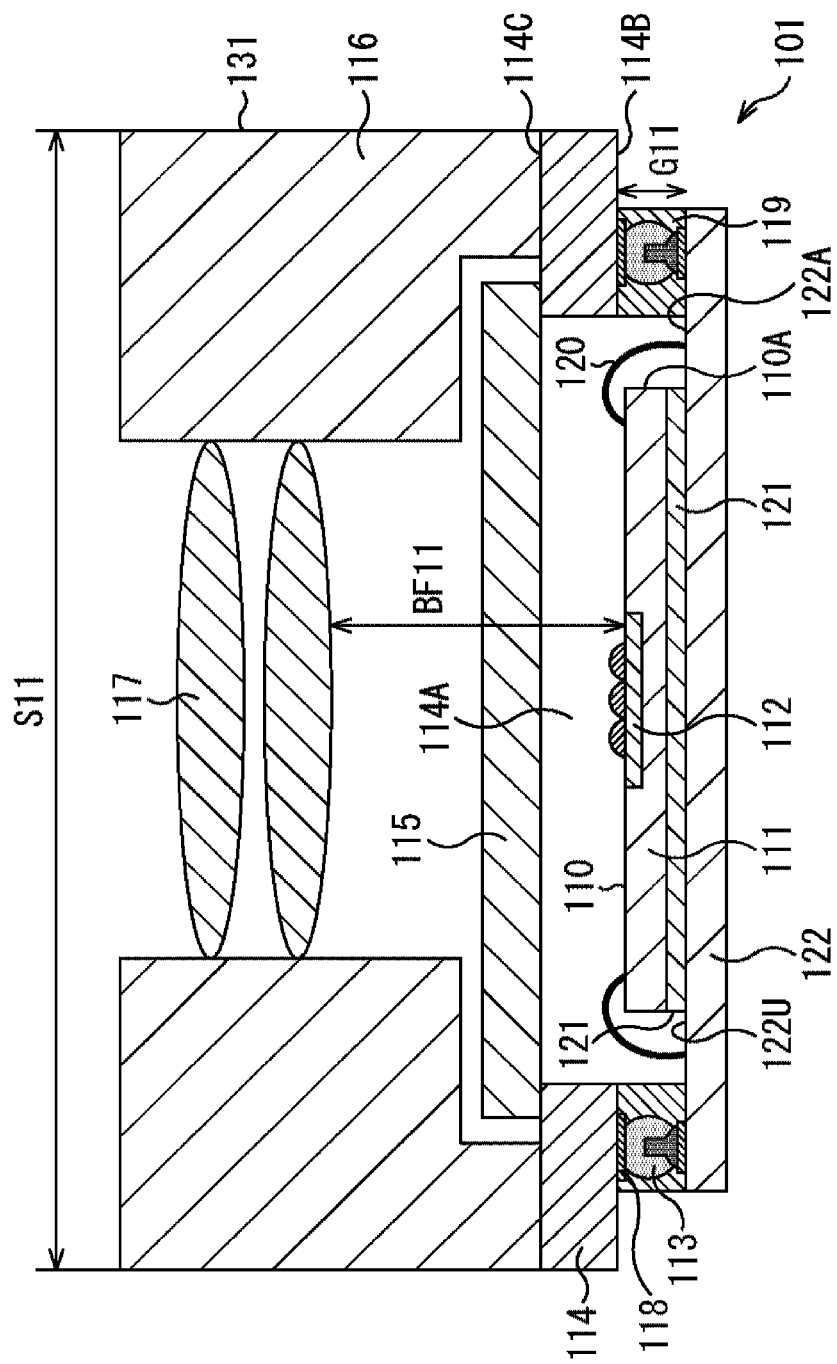
FIG. 3 is a view showing a configuration of a cross section of an optical module 101 of the present technique.

FIG. 3 is a view showing a configuration of a cross section of an optical module 101 of the present technology. For example, in the optical module 101 which configures a camera module to be incorporated in a camera, a sensor 110 is configured from a logic section 111 and a light reception section 112. A circuit for processing pixel data outputted from the light reception section 112 is formed in the logic section 111. The light reception section 112 is formed on the upper face side of a substantially central portion of the logic section 111. In FIG. 3, protrusions shown in a semispherical shape on an upper face of the light reception section 112 are portions which configure pixels of red, green, blue and so forth, and include lenses for converging light to corresponding light reception elements. In FIG. 3, while only three protrusions are shown for simplified illustration, actually a great number of pixels are formed.

The sensor 110 is different in size from a memory chip 122. In particular, the sensor 110 is smaller in size than the memory chip 122 and is directly joined in an overlapping relationship to an upper face 122U substantially centrally of the memory chip 122 by a die bond material 121. The memory chip 122 is a memory for storing pixel data imaged by and outputted from the sensor 110 and is configured, for example, from a DRAM (Dynamic Random Access Memory).

The memory chip 122 is flip-chip connected at a periphery thereof to a face 114B of the substrate 114 on the lower side in FIG. 3 through a pad 118 by bumps 113, for example, of gold (Au) as a conductive material. The bumps 113 which are a flip-chip connection portion are sealed by an underfill 119 applied for reinforcement.

An opening 114A for allowing light to enter the light reception section 112 therethrough is formed substantially at the center of the substrate 114. The sensor 110 is joined to the upper face 122U of the memory chip 122 so as to project from the memory chip 122 into the opening 114A. In particular, since the size of the sensor 110 is smaller than that of the memory chip 122, a step is formed by the thickness of the sensor 110 between the memory chip 122 and the sensor 110. A filter 115 is joined to a face 114C of the substrate 114 on the upper side in FIG. 3 so as to close up the opening 114A. The filter 115 prevents entering of infrared rays into the light reception section 112 and prevents dust from dropping to the pixel face of the light reception section 112.

A lens unit 131 is configured from a retention member 116 and a lens 117 retained by the retention member 116. The retention member 116 is joined to the face 114C of the substrate 114 opposing to the face 114B.

The sensor 110 and the memory chip 122 are connected to each other by wires 120, for example, of gold as a conductive material. The wires 120 are connected to a periphery of a face of the sensor 110 on the opening 114A side and a region 122A of the memory chip 122 between the flip-chip connected bumps 113 and an end face 110A of the sensor 110.

It is to be noted that an actuator for operating the lens 117 can be provided in the retention member 116 such that also a so-called automatic focusing function is applied.

By the configuration described above, light from an image pickup object enters the light reception section 112 through the lens 117 and the filter 115. Pixel data generated by the light reception section 112 is processed by the circuit of the logic section 111 and outputted to the outside.

In the present structure, since the flip-chip connection to the memory chip 122 is applied, even if supersonic vibration is utilized upon flip-chip connection, damage such as a crack does not appear at the connection portion of the memory chip 122 to the substrate 114. Further, since the wires 120 which are stable in connection are connected to the sensor 110 and the memory chip 122, a robust structure design for a connection structure is implemented and the connection quality is stabilized.

Figure 1:
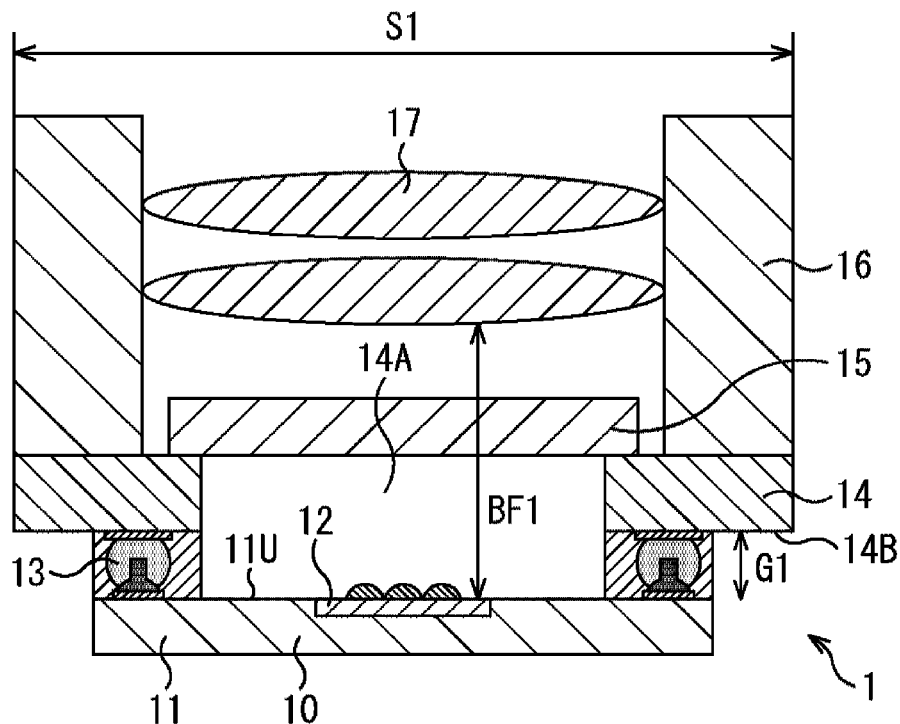
FIG. 1 is a view showing a principle configuration of a cross section of a conventional optical module 1.

In particular, if the flip-chip connection is carried out for the logic section 11 of the sensor 10 as shown in FIG. 1, then the sensor 10 is sometimes damaged. This point is described with reference to FIGS. 4A and 4B.

Several methods are available for the flip-chip connection of the sensor 10. In a method in which solder or silver (Ag) paste is used for the connection, a lens (lens (not shown) existing for each pixel of the light reception section 12) on the sensor 10 is sometimes damaged by heat upon heating. Since also a method of pressure contacting gold (Au) and gold with each other requires heating, the lens is sometimes damaged similarly.

As a method for the flip-chip connection by which a low temperature is used for connection, a method is available wherein gold is joined in short time by ultrasonic waves. However, this method has a problem that a portion connected by the bumps 13 of the logic section 11 is liable to be damaged by the amplitude upon ultrasonic joining.

Figure 4A:
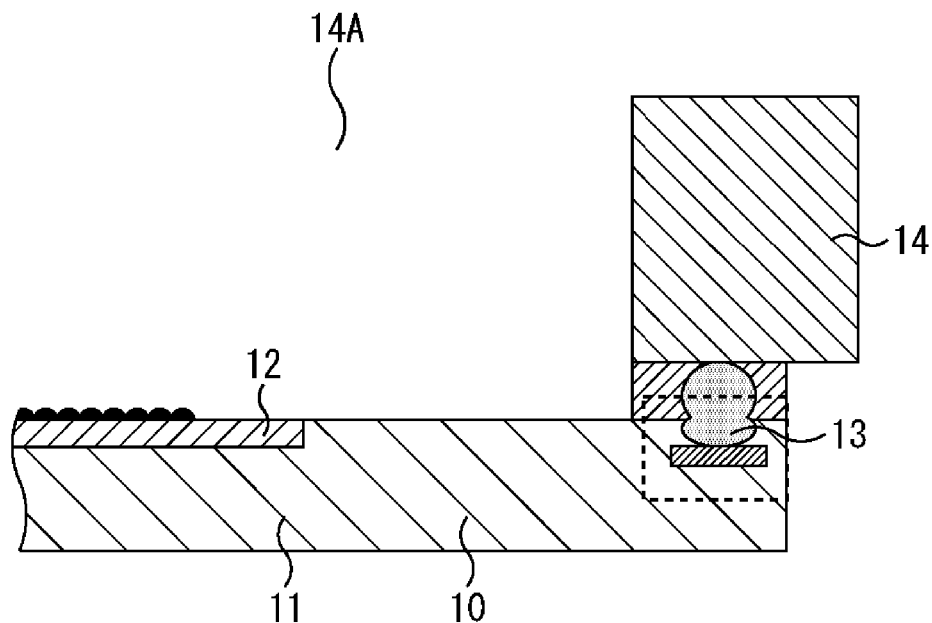
FIGS. 4A and 4B are views illustrating an example of damage.
Figure 4B:
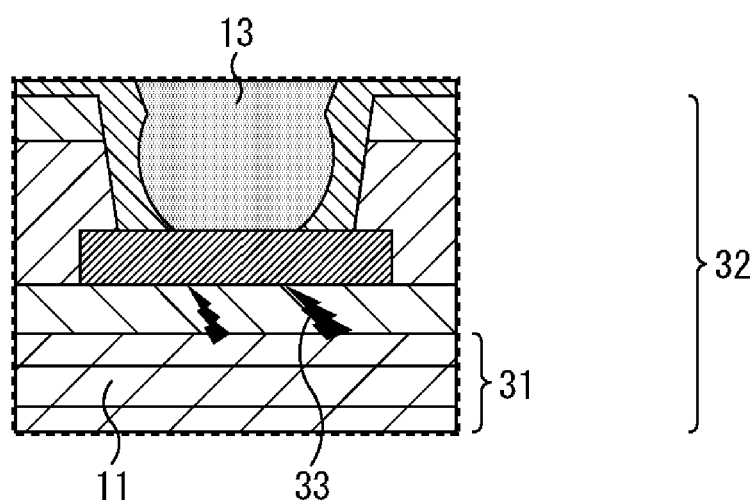

FIGS. 4A and 4B are views showing an example of damage. In FIG. 4A, a portion connected by a bump 13 of the logic section 11 is shown surrounded by a broken line. FIG. 4B shows a range surrounded by the broken line in FIG. 4A in an enlarged scale. As shown in FIG. 4B, a low-relative dielectric constant film (Low-K film) 31 is formed at the portion of the logic section 11 connected by the bump 13, and an interlayer film 32 is formed on the low-relative dielectric constant film 31. A process for joining the bump 13 by ultrasonic vibration is carried out at the same time for all of the bumps 13 positioned on the periphery of the sensor 10. As a result, arising from the ultrasonic vibration, damage such as a crack 33 sometimes appears on the low-relative dielectric constant film 31 and the interlayer film 32.

In the optical module 101 of FIG. 3, the possibility is low that such damage as described above may appear.

It is to be noted that, as the sensor 110 of the optical module 101 of FIG. 3, a sensor having a size equal to that of the sensor 10 of FIG. 1 can be used. In this instance, in order to secure a region for forming the bumps 113 therein, it is necessary to make the size (length in a horizontal direction in FIG. 3) of the memory chip 122 greater than that of the sensor 110. Therefore, even if a lens having a diameter equal to that of the lens 17 of FIG. 1 is used as the lens 117, it is necessary to make the outer diameter of the retention member 116 greater than that of the retention member 16 of FIG. 1. Accordingly, the module size (outer diameter of the retention member 116) S11 of the optical module 101 of FIG. 3 is greater than the module size (outer diameter of the retention member 16) S1 of the optical module 1 of FIG. 1.

Further, in the optical module 101 of FIG. 3, the position of the light reception section 112 comes nearer to the lens 117 by a distance equal to the thickness of the sensor 110 in comparison with the optical module 1 of FIG. 1. Accordingly, generally the length BF11 of a back focus which is a distance between the lens 117 retained by the retention member 116 and the light reception section 112 is shorter than the length BF1 of the back focus which is the distance between the lens 17 and the light reception section 12 of FIG. 1.

If the back focus is long, then the focal depth of the lens 117 generally is great, and the fabrication dispersion is liable to be absorbed with respect to the parallelism between the pixel face and the lens unit 131. Consequently, a fabrication process of a low cost can be implemented. In particular, the lens unit 131 can be adhered to the substrate 114 while tilt correction of the lens unit 131 is not carried out. In other words, if the length BF11 of the back focus is set excessively short, then this sometimes becomes disadvantageous.

In the case of an optical module which requires a back focus, the length of a gap G11 which is the length of the connection portion by the bumps 113 of FIG. 3 (distance between the upper face 122U of the memory chip 122 and the lower face 114B of the substrate 114) can be adjusted when necessary. In particular, the length of the gap G11 can be set longer than that of the gap G1 which is the length of the connection portion by the bumps 13 of FIG. 1 (distance between the upper face 11U of the logic section 11 and the lower face 14B of the substrate 14). Consequently, the length BF11 of the back focus can be set equal to or greater than the length BF1 of the back focus.

Figure 10:
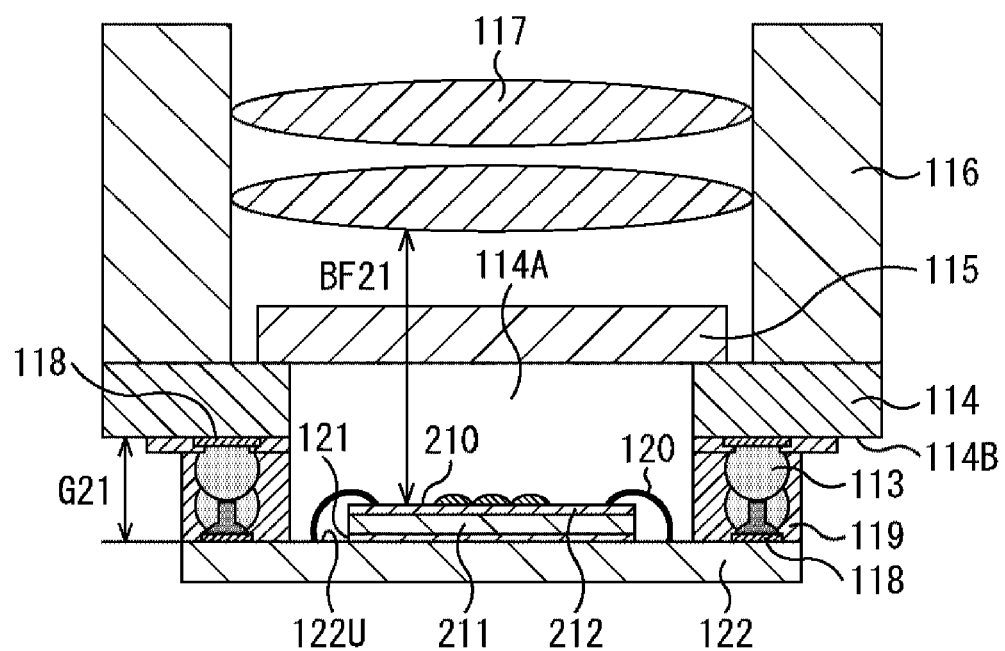
FIG. 10 is a view illustrating a back focus.

It is to be noted that the back focus is described in more detail with reference to FIG. 10 hereinafter described.

Configuration of the Fabrication Apparatus

Figure 5:
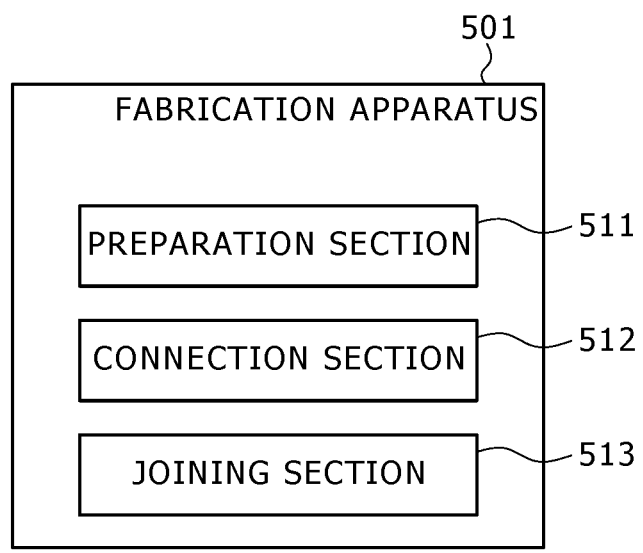
FIG. 5 is a block diagram showing a functional configuration of a fabrication apparatus 501.

Now, a fabrication apparatus 501 for the optical module 101 described hereinabove is described. FIG. 5 is a block diagram showing a functional configuration of the fabrication apparatus 501. As shown in FIG. 5, the fabrication apparatus 501 includes a preparation section 511, a connection section 512, and a joining section 513.

The preparation section 511 prepares predetermined members. The connection section 512 carries out electric connection and so forth. For example, formation of bumps, flip-chip connection, wire bonding and so forth are carried out. The joining section 513 joins a sensor 110 and adheres a filter 115 and a lens unit 131.

Fabrication Process

Figure 6:
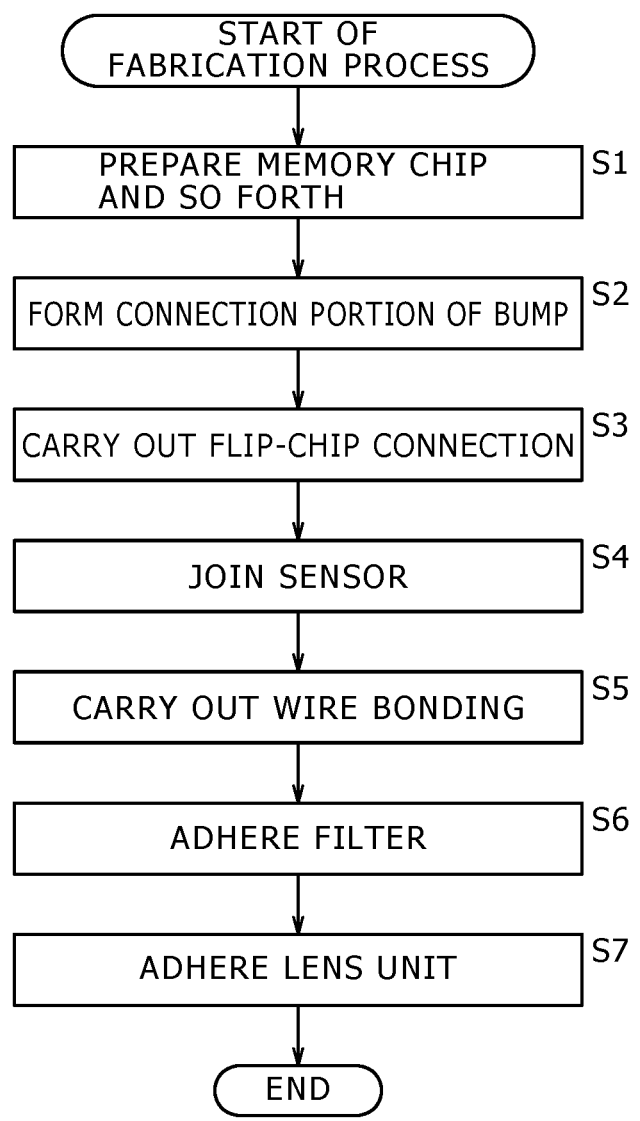
FIG. 6 is a flow chart illustrating a fabrication method for the optical module 101.

Now, a fabrication method for the optical module 101 of FIG. 3 is described. FIG. 6 is a flow chart illustrating a fabrication method for the optical module 101, and FIGS. 7A, 7B, 7C, 7D, and 7E are views illustrating a fabrication process of the optical module 101 of FIG. 3.

Figure 7A:
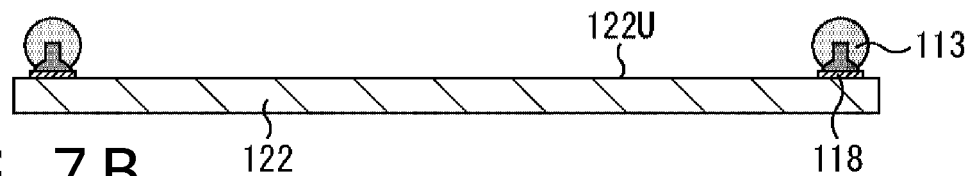
FIGS. 7A, 7B, 7C, 7D, and 7E are views illustrating a fabrication process for the optical module 101 of FIG. 3.

At step S1, the preparation section 511 prepares a memory chip 122 and so forth. Naturally, at this time, necessary members other than the memory chip 122 are prepared. For example, also a sensor 110, a substrate 114, a filter 115, a lens unit 131 and so forth are prepared. At step S2, the connection section 512 forms bumps 113 on a periphery of the face 122U of the memory chip 122 on the upper side in FIG. 7A, as illustrated in FIG. 7A. For example, stud bumps are formed from a gold wire, and it is possible to form the connection gap G11 which is the distance between the lower face 114B of the substrate 114 and the upper face 122U of the memory chip 122 at multiple stages as occasion demands to adjust the same. Although, in the case of the present embodiment, the bump formation is carried out on the memory chip 122 after dicing, also it is possible to carry out the bump formation on a wafer for a memory before the dicing. In the case where the bumps are formed by plating, preferably they are formed on the wafer level.

Further, while, in the present fabrication method, the bumps 113 are formed on the memory chip 122 side, the bumps 113 may otherwise be formed on the substrate 114 side. In the case where the bumps 113 are formed at multiple stages, also it is possible to form the bumps 113 on both of the memory chip 122 and the substrate 114 and flip-chip connect the bumps 113.

Figure 7B:
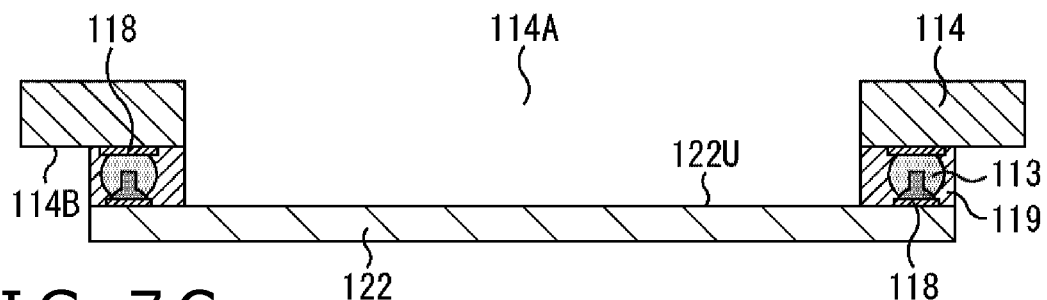

At step S3, the connection section 512 carries out flip-chip connection. In particular, the memory chip 122 is connected to the lower face 114B of the substrate 114 through the bumps 113 as shown in FIG. 7B. At this time, ultrasonic vibration is utilized, and all bumps 113 on the periphery of the memory chip 122 are connected at the same time. Since the low-relative dielectric constant film 31 or the interlayer film 32 shown in FIGS. 4A and 4B is not formed on the periphery of the memory chip 122, the possibility that damage such as a crack may appear is low. Further, to the bumps 113, an underfill 119 is applied for reinforcement to carry out sealing. Consequently, the memory chip 122 is flip-chip connected on the periphery thereof to the face 114B of the substrate 114 on the lower side in FIG. 7B through the pad 118 by the bumps 113.

Since the sensor 110 is mounted on the memory chip 122 later, at this time, it is necessary to leave the opening 114A of the substrate 114 open. If dust is placed on the pixel face of the light reception section 112 of the sensor 110, then there is the possibility that the picture quality may be deteriorated. Therefore, it is necessary to select, as the substrate 114, a substrate wherein dust does not appear from an end face of the opening 114A. Therefore, for the substrate 114, preferably a ceramic substrate or an organic substrate whose opening 114A is coated at an end face thereof to prevent appearance of dust.

Figure 7C:
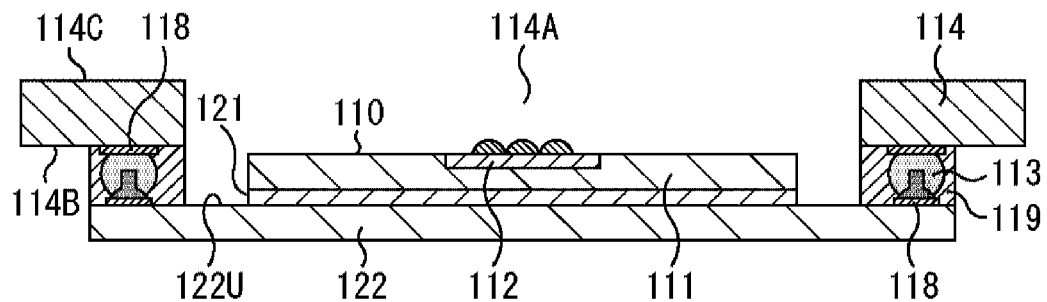

At step S4, the joining section 513 joins the sensor 110. In particular, the sensor 110 is joined to the upper face 122U of the memory chip 122 through a die bond material 121 as illustrated in FIG. 7C.

Figure 7D:
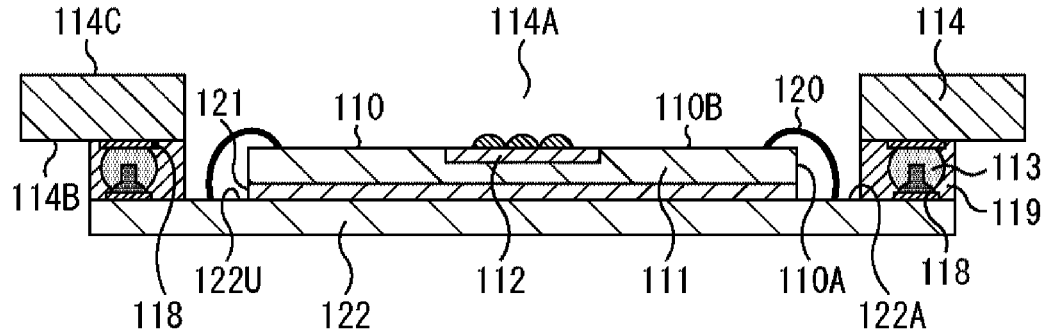

At step S5, the connection section 512 carries out wire bonding. This state is illustrated in FIG. 7D. In particular, load is applied, for example, by a capillary 301 (refer to FIG. 11 hereinafter described) to connect the wires 120 between the sensor 110 and the memory chip 122. More particularly, the wires 120 are connected between a periphery of a face 110B of the sensor 110 on the opening 114A side and a region 122A of the memory chip 122 between the flip-chip connected bumps 113 and the end face 110A of the sensor 110.

Although load and ultrasonic vibration are applied upon connection of the wires 120, this process is carried out for one by one of the wires 120. As a result, the low-relative dielectric constant film 31 or the interlayer film 32 (refer to FIGS. 4A and 4B) of the logic section 111 is scarcely damaged.

Figure 7E:
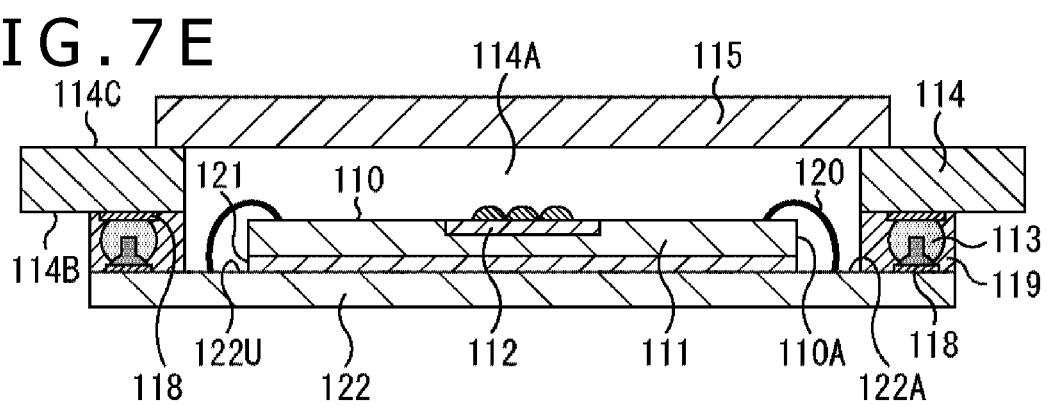

At step S6, the joining section 513 adheres the filter 115. In particular, the filter 115 is adhered to a face 114C of the substrate 114 so as to close up the opening 114A as illustrated in FIG. 7E.

At step S7, the joining section 513 adheres the lens unit 131. In particular, a retention member 116 which retains a lens 117 is adhered at an end portion thereof to the face 114C of the substrate 114 as illustrated in FIG. 3.

It is to be noted that, in the fabrication flow described above, the sensor 110 is bonded by die bonding and wire bonding to the memory chip 122 after the memory chip 122 is flip-chip connected to the substrate 114. However, the memory chip 122 may be flip-chip connected to the substrate 114 after the sensor 110 is bonded to the memory chip 122 by die bonding or wire bonding. In this instance, it is necessary to prepare such a collet as handles a wire for wire bonding so as not to be deformed.

FIG. 8 illustrates a state of reflection of light of the optical module 101 of FIG. 3. It is to be noted that, in FIG. 8, the width of an arrow mark which signifies light represents the amount of light. Since the light amount is attenuated by reflection, the width of the arrow mark of reflected light is smaller than the width of the incident light.

As shown in FIG. 8, also part of light entering through the lens 117 and the filter 115 (refer to FIG. 3) is reflected by the end face 114D of the substrate 114, and part of the reflected light advances toward the sensor 110. However, since the sensor 110 projects in a direction toward the opening 114A from the upper face 122U of the memory chip 122 and the light reception section 212 is positioned higher than the upper face 122U of the memory chip 122. Further, the light reception section 112 is spaced away from the end face 114D by a distance corresponding to the region 122A.

Figure 2:
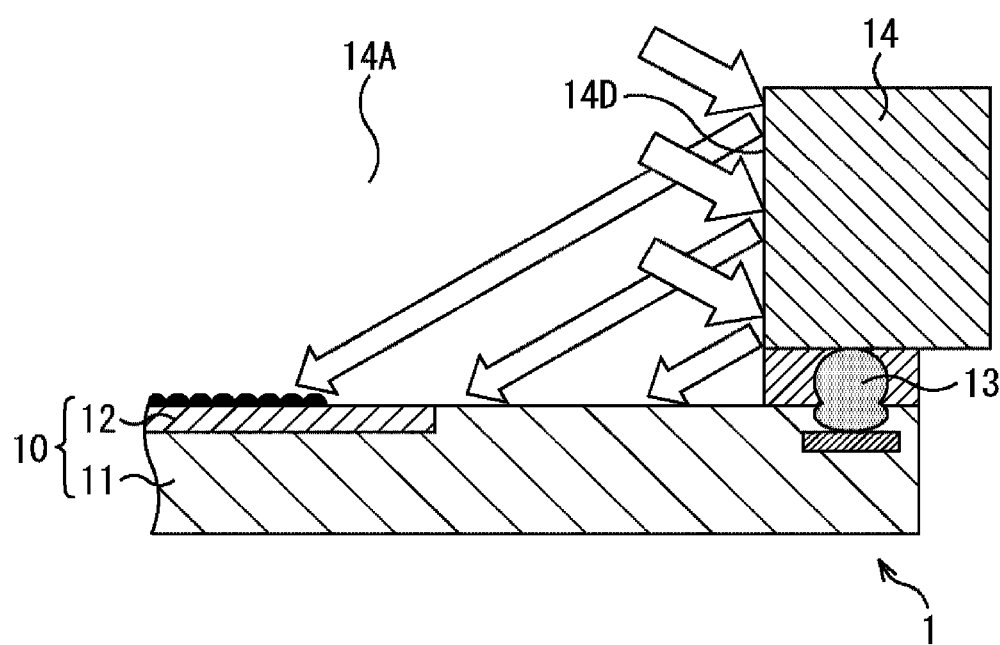
FIG. 2 is a view illustrating a state of reflection of light of the optical module 1.

As a result, the light amount of the reflected light entering the light reception section 112 decreases in comparison with that in the case of the light reception section 12 of FIG. 2. In particular, in order to prevent light reflected in the optical module 101 from entering the light reception section 112, the step provided by the thickness of the sensor 110 is utilized to cut part of the reflected light by the end face 110A of the sensor 110. Although part of the light reflected by the wires 120 enters the light reception section 112, the amount of the light is small. Accordingly, the possibility that a ghost may appear is lower in the case illustrated in FIG. 8 than in the case illustrated in FIG. 2.

2. Second Embodiment (Case Wherein a Stacked Sensor is Used)

Structure of the Optical Module

Figure 9:
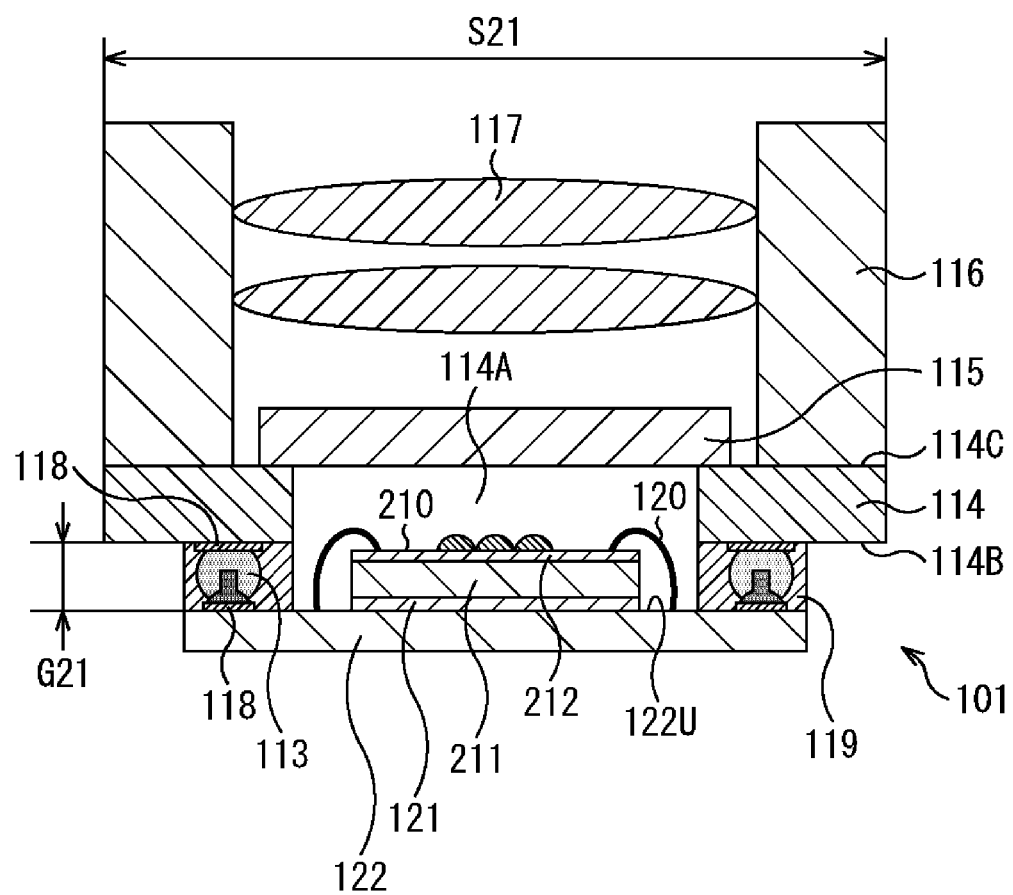
FIG. 9 is a view showing a configuration of a cross section of another optical module 101 of the present technique

Now, a second embodiment is described. FIG. 9 is a view showing a configuration of a cross section of another optical module 101 of the present technology. The configuration of the optical module 101 shown in FIG. 9 is basically same as that of the optical module 101 shown in FIG. 3. In particular, while, in the optical module 101 of FIG. 3, the sensor 110 is configured from a non-stacked sensor, the optical module 101 of FIG. 9 is different from that in the case of FIG. 3 in that a sensor 210 is configured from a stacked sensor. In the non-stacked sensor, the light reception section 112 which receives light and outputs corresponding pixel data is formed on a plane same as that of the logic section 111 which processes the pixel data outputted from the light reception section 112, as shown in FIG. 3. In contrast, the stacked sensor has a structure wherein a light reception section 212 which receives light and outputs corresponding pixel data is stacked on a logic section 211 which processes the pixel data outputted from the light reception section 212 as shown in FIG. 9.

Since the sensor 210 is a stacked sensor, the light reception section 212 is formed on the logic section 211. As a result, the thickness of the sensor 210 is greater than that of the sensor 110. However, the magnitude (size) of the sensor 210 in a direction of the plane is smaller than that of the sensor 110 which is a non-stacked sensor. Therefore, in the case where a lens of a size equal to that of the lens 17 of FIG. 1 is used as the lens 117 of FIG. 9, the diameter of the retention member 116 can be made equal to that of the retention member 16. In other words, the module size S21 of the optical module 101 of FIG. 9 can be made equal to or smaller than the module size S1 of the optical module 1 of FIG. 1. Further, the module size S21 of the optical module 101 of FIG. 9 can be made smaller than the sizes S11 and S13 of the optical modules 101 of FIG. 3 and an optical module 101 of FIG. 15 hereinafter described.

Also in the present embodiment, the length of the gap G21 can be adjusted as occasion demands similarly as in the case of FIG. 3. FIG. 10 is a view illustrating a back focus. As shown in FIG. 10, the gap G21 which is a length of a connection portion by bumps 113 is the distance between the upper face 122U of the memory chip 122 and the lower face 114B of the substrate 114. It is possible to make the length of the gap G21 greater than the length of the gap G1 of FIG. 1 and adjust the length BF21 of the back focus to a length equal to or greater than the length BF1 of the back focus of FIG. 1.

Further, also it is possible to adjust the length of the back focus not only by making the gap G21 for flip chip connection longer but also by polishing the sensor 210 to a thickness smaller than that of the sensor 110 (or the sensor 10) together with or separately from such elongation of the gap G21.

With the structure of the sensor 10 of the optical module 1 of FIG. 1, the sensor 10 can be made thin only to a thickness of approximately 100 to 200 μm. This is because, although the pixel face preferably is flat, if silicon which is a material of the sensor 10 is made thin, then a warp appears with the sensor 10, resulting in deterioration of the picture quality in that the pixel face of the light reception section 12 is positioned outside the focus of the lens 17 or the resolution drops due to the warp.

In the structure of the optical module 101 of the present technology, since the memory chip 122 which is made of silicon which assures the flatness exists below, the thickness of silicon on the sensor 210 side can be made small. For example, the thickness of the silicon can be reduced to approximately 30 μm. By joining the sensor 210 to the memory chip 122 in this manner, the thickness of the sensor 210 can be reduced by at least part of an amount by which the distance of the back focus is reduced by the thickness of the sensor 210. Comprehensively, the length BF21 of the back focus can be adjusted by adjusting at least one of the thickness of the sensor 210 and the length of the bumps 113 (length of the gap G21).

The gap G21 can be adjusted, for example, by adjusting the bumps 113 among multiple stages or, in the case where the bumps 113 is formed by plating, by the thickness of the plating. Also it is possible to adjust the gap G21 by increasing the pre-coat amount of the bumps 113 or silver (Ag) paste as a conductive material.

Figure 11:
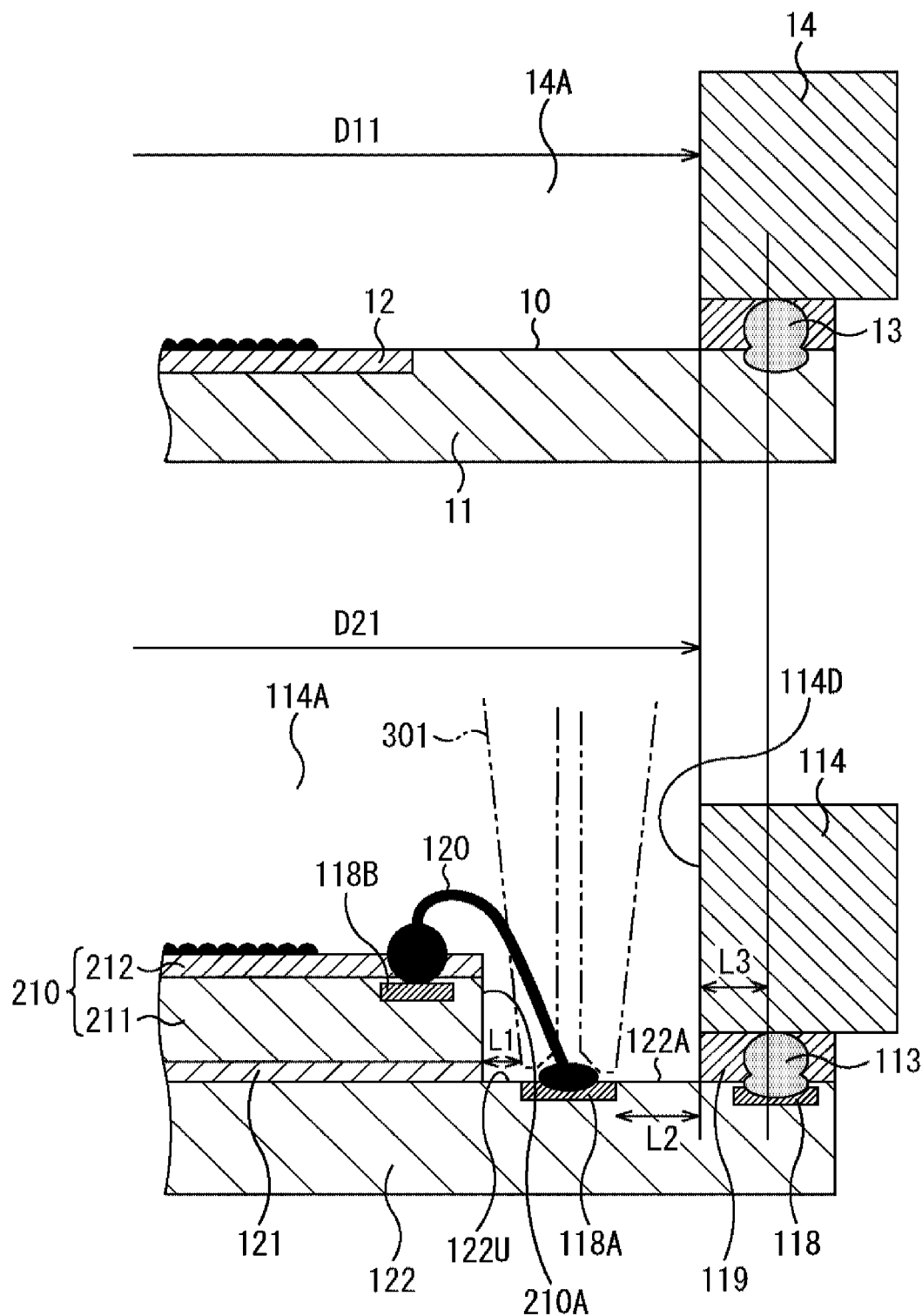
FIG. 11 is a view illustrating a state of connection of a wire 120.

FIG. 11 is a view illustrating a state of connection of a wire 120. As shown in FIG. 11, to a pad 118A in a region 122A of the upper face 122U of a memory chip 122 between an end face 210A of the sensor 210 and an end face 114D of the substrate 114, the wire 120 is connected at one end thereof. The wire 120 is connected at the other end thereof to a pad 118B of the sensor 210.

For the connection of the wire 120, a capillary 301 is used. Therefore, the distance L1 between the end face 210A of the sensor 210 and an end portion of the pad 118A on the left side in FIG. 11 and the distance L2 from the end face 114D of the substrate 114 on the left side in FIG. 11 to an end portion of the pad 118A on the right side in FIG. 11 are defined by the size of the capillary 301.

On the upper side in FIG. 11, the substrate 14 of the optical module 1 of FIG. 1 and the sensor 10 joined to the substrate 14 are shown for comparison. The diameter of the opening 14A of the substrate 14 is represented by D11. By using a stacked sensor which is small in size and in which the capillary 301 can be used in the region 122A as the sensor 210, it is possible to make the diameter D21 of the opening 114A of the substrate 114 equal to or smaller than the diameter D11. In other words, by forming the sensor 210 in the form of a stacked sensor in an SiP (System in Package) by wire bonding, the size of the optical module 101 can be made equal to or smaller than the size of the optical module 1.

Figure 12:
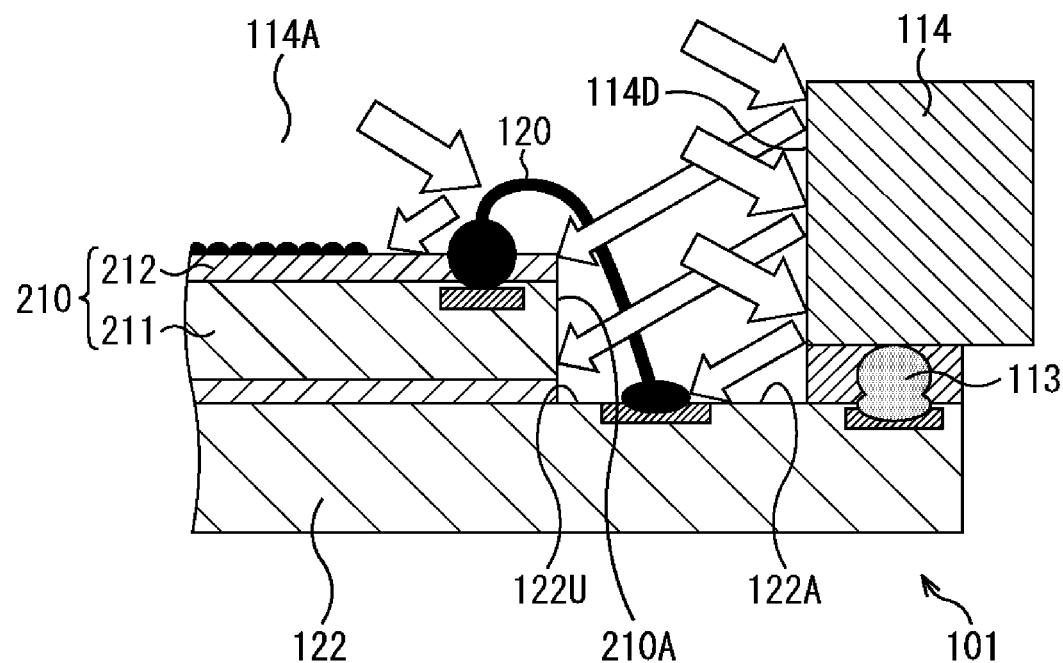
FIG. 12 is a view illustrating a state of reflection of light of the optical module 101 of FIG. 9.

FIG. 12 represents a state of reflection of light of the optical module 101 of FIG. 9. It is to be noted that, also in FIG. 12, the width of an arrow mark which signifies light represents a light amount. Since the light amount decreases by the reflection, the width of an arrow mark of the reflected light is smaller than the width of the incident light.

As shown in FIG. 12, part of light entering through the lens 117 and the filter 115 (refer to FIG. 9) is reflected by the end face 114D of the substrate 114, and part of the reflected light advances toward the sensor 210. However, the sensor 210 projects toward the opening 114A from the upper face 122U of the memory chip 122 (a step is formed between the sensor 210 and the memory chip 122), and the light reception section 212 is positioned higher than the upper face 122U of the memory chip 122. Further, the light reception section 212 is spaced away from the end face 114D by an amount of the region 122A.

As a result, the light amount of the reflected light entering the light reception section 212 decreases in comparison with that of a case of the light reception section 12 of FIG. 2. In other words, in order to prevent light reflected in the optical module 101 from being introduced to the light reception section 112, the step provided by the thickness of the sensor 210 is utilized so that part of the reflected light is cut by the end face 210A of the sensor 210. Although part of the light reflected by the wires 120 enters the light reception section 212, the amount of the light is very small. Accordingly, the possibility that a ghost may appear is lower in the case illustrated in FIG. 12 than in the case illustrated in FIG. 2.

Figure 13:
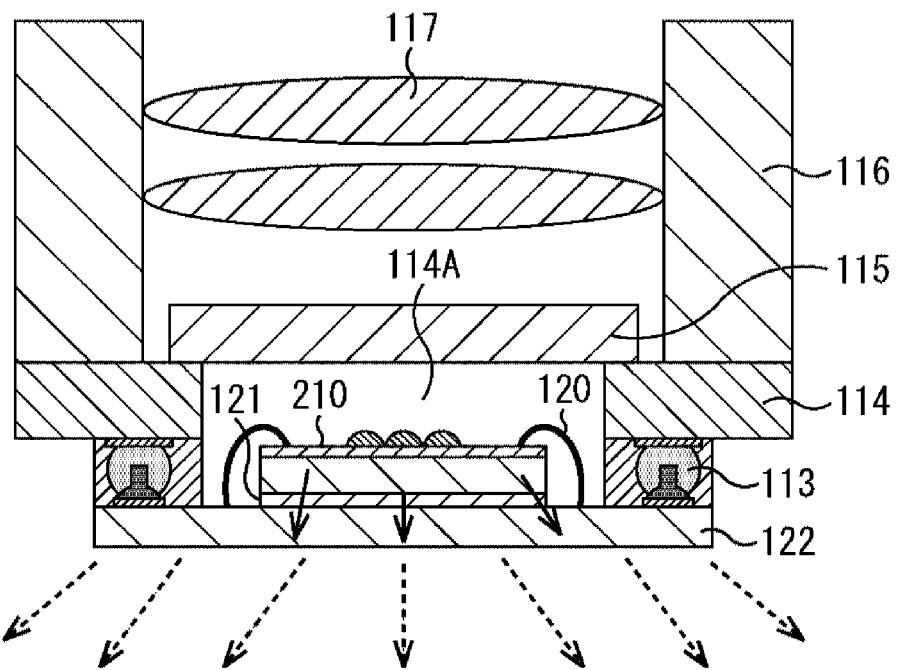
FIG. 13 is a view illustrating heat radiation.

FIG. 13 is a view illustrating heat radiation. As shown in FIG. 13, heat generated by the sensor 210 is transmitted to the memory chip 122 and then radiated from the memory chip 122. Accordingly, a rise of the temperature of the sensor 210 is suppressed, and degradation of pixel data by heat is suppressed.

Further, since the memory chip 122 is directly joined immediately below the sensor 210 through the die bond material 121, the wiring distance between them, namely, the length of the wires 120, can be made short. As a result, it is possible to accumulate pixel data from the sensor 210 at a high speed into the memory chip 122 thereby to allow a high speed image process. Consequently, such an image process as global shuttering and increase of the dynamic range becomes possible. It is to be noted that the optical module 101 of FIG. 9 is advantageous for high speed processing in comparison with an optical module 101 of FIG. 15 hereinafter described. This is because, since the memory chip 122 and the substrate 114 are not connected to each other by wires 120B as in the case of FIG. 15, there is no influence of the parasitic capacitance of the wires 120B.

Further, the height of the optical module 101 of FIG. 9 can be reduced by an amount corresponding to the thickness of the substrate 114 in comparison with the optical module 101 of FIG. 15 hereinafter described similarly to the optical module 101 of FIG. 3.

It is to be noted that effects of the embodiment of FIG. 9 described above are exhibited similarly also with the embodiment of FIG. 3.

Fabrication Process

A fabrication method of the optical module 101 of FIG. 9 is described. FIGS. 14A, 14B, 14C, 14D, and 14E are views illustrating a fabrication process of the optical module 101 of FIG. 9. As apparent from comparison of FIGS. 14A, 14B, 14C, 14D, and 14E with FIGS. 7A, 7B, 7C, 7D, and 7E, FIGS. 14A, 14B, 14C, 14D, and 14E are different from FIGS. 7A, 7B, 7C, 7D, and 7E only in that the sensor 110 in the form of a non-stacked sensor of FIGS. 7A, 7B, 7C, 7D, and 7E are changed to the sensor 210 in the form of a stacked sensor, and the other steps are similar to those in the case of FIGS. 7A, 7B, 7C, 7D, and 7E. Accordingly, the fabrication apparatus and the fabrication method of the optical module 101 of FIG. 9 are basically similar to those in the case shown in FIGS. 5 and 6.

Figure 14A:
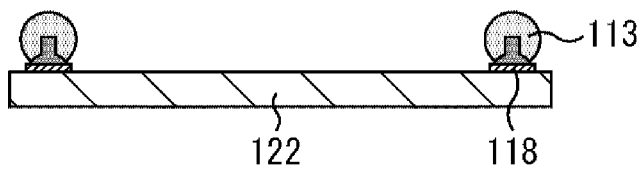
FIGS. 14A, 14B, 14C, 14D, and 14E are views illustrating a fabrication process for the optical module 101 of FIG. 9.

At step S1, the preparation section 511 prepares a memory chip 122 and so forth. Naturally, at this time, necessary members other than the memory chip 122 are prepared. For example, also the sensor 210, substrate 114, filter 115, lens unit 131 and so forth are prepared. At step S2, the connection section 512 forms bumps 113 on a periphery of the face 122U of the memory chip 122 on the upper side in FIG. 14A, as illustrated in FIG. 14A. For example, stud bumps are formed from a gold wire, and it is possible to form the connection gap G21, which is a distance between the lower face 114B of the substrate 114 and the upper face 122U of the memory chip 122, at multiple stages as occasion demands so as to allow adjustment. The formation of the bumps 113 may be carried out on the memory chip 122 after dicing or may be carried out on a wafer for a memory before dicing. Where the bumps 113 are formed by plating, preferably they formed on the wafer level.

Further, while, in the present fabrication method, the bumps 113 are formed on the memory chip 122 side, the bumps 113 may otherwise be formed on the substrate 114 side. Where such bumps 113 are formed at multiple stages, it is possible to form the bumps 113 on both of the memory chip 122 and the substrate 114 and flip-chip connect the bumps 113.

Figure 14B:
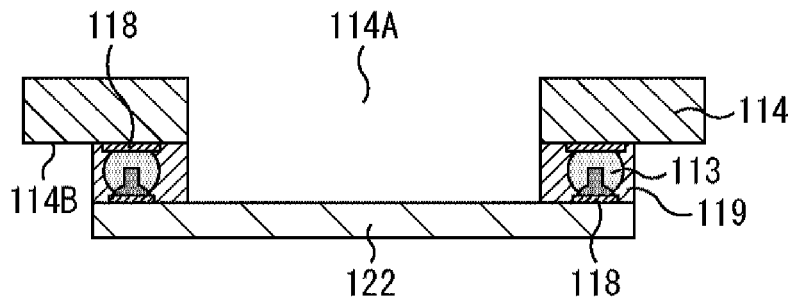

At step S3, the connection section 512 carries out flip-chip connection. In particular, as shown in FIG. 14B, the memory chip 122 is connected to the lower face 114B of the substrate 14 through the bumps 113. Then, an underfill 119 is applied for reinforcement to the bumps 113 to seal the bumps 113. Consequently, the memory chip 122 is flip-chip connected through the bumps 113 at a periphery thereof to the face 114B of the substrate 114 on the lower side in FIG. 14A through pads 118.

Since the sensor 210 is mounted on the memory chip 122 later, at this time, it is necessary to keep the opening 114A of the substrate 114 open. If dust is placed on the pixel face of the light reception section 212 of the sensor 210, then there is the possibility that the picture quality may become poor. Therefore, it is necessary to select a substrate wherein dust does not appear from an end face of the opening 114A as the substrate 114. Therefore, preferably a ceramic substrate or an organic substrate wherein the end face of the opening 114A is coated to prevent production of dust is used as the substrate 114.

Figure 14C:
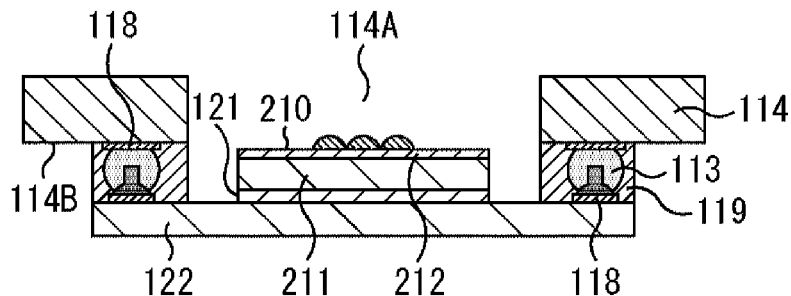

At step S4, the joining section 513 joins the sensor 210. In particular, the sensor 210 is joined directly to the upper face 122U of the memory chip 122 through the die bond material 121 as illustrated in FIG. 14C.

Figure 14D:
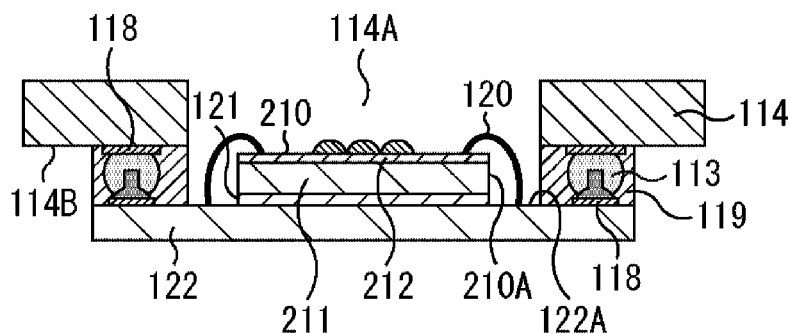

At step S5, the connection section 512 carries out wire bonding. This state is illustrated in FIG. 14D. In particular, load and ultrasonic vibration are applied by the capillary 301 to connect the wires 120 to a periphery of the light reception section 212 of the sensor 210 and the region 122A of the memory chip 122.

It is to be noted that, although load and ultrasonic vibration are applied upon connection of the wires 120, this process is carried out for one by one of wires 120. As a result, the memory chip 122 is seldom damaged. However, there is the possibility that the characteristic of the memory chip 122 may be influenced by the load and the ultrasonic wave. Therefore, it is safer if the area of the memory chip 122 in which wire bonding is to be carried out is determined as a region in which formation of memory cells is inhibited while only a wiring line layer is formed similarly to the flip-chip connection portion as a precautionary measure.

Figure 14E:
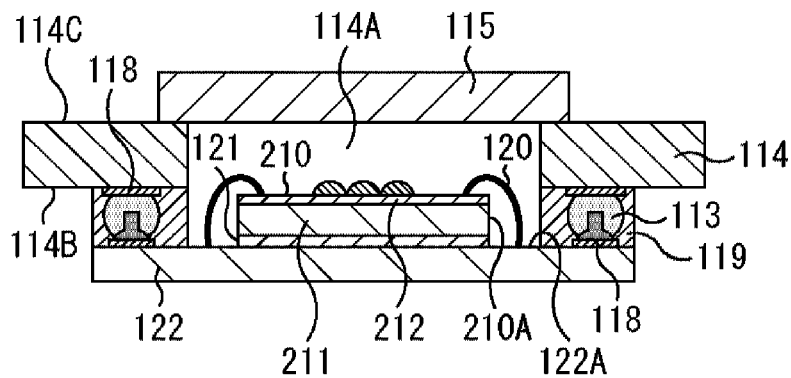

At step S6, the joining section 513 adheres the filter 115. In particular, the filter 115 is adhered to the face 114C of the substrate 114 so as to close up the opening 114A as illustrated in FIG. 14E.

At step S7, the joining section 513 adheres the lens unit 131. In particular, the retention member 116 which retains the lens 117 is adhered at an end portion thereof to the face 114C of the substrate 114 as shown in FIG. 9.

It is to be noted that, in the fabrication flow described above, the sensor 210 is bonded to the memory chip 122 by die bonding and wire bonding after the memory chip 122 is flip-chip connected to the substrate 114. However, the memory chip 122 may be flip-chip connected to the substrate 114 after the sensor 210 is bonded to the memory chip 122 by die bonding and wire bonding. In this instance, it is necessary to prepare such a collet for handling wires for wire bonding so as not to be deformed.

Modification

In the foregoing description, in order to prevent damage to the sensors 110 and 210, the sensors 110 and 210 are adhered to the memory chip 122, and then the memory chip 122 is connected to the substrate 114 by the bumps 113. Also it is possible to connect the memory chip 122 to the substrate 114 by wires 120 in place of the bumps 113.

Figure 15:
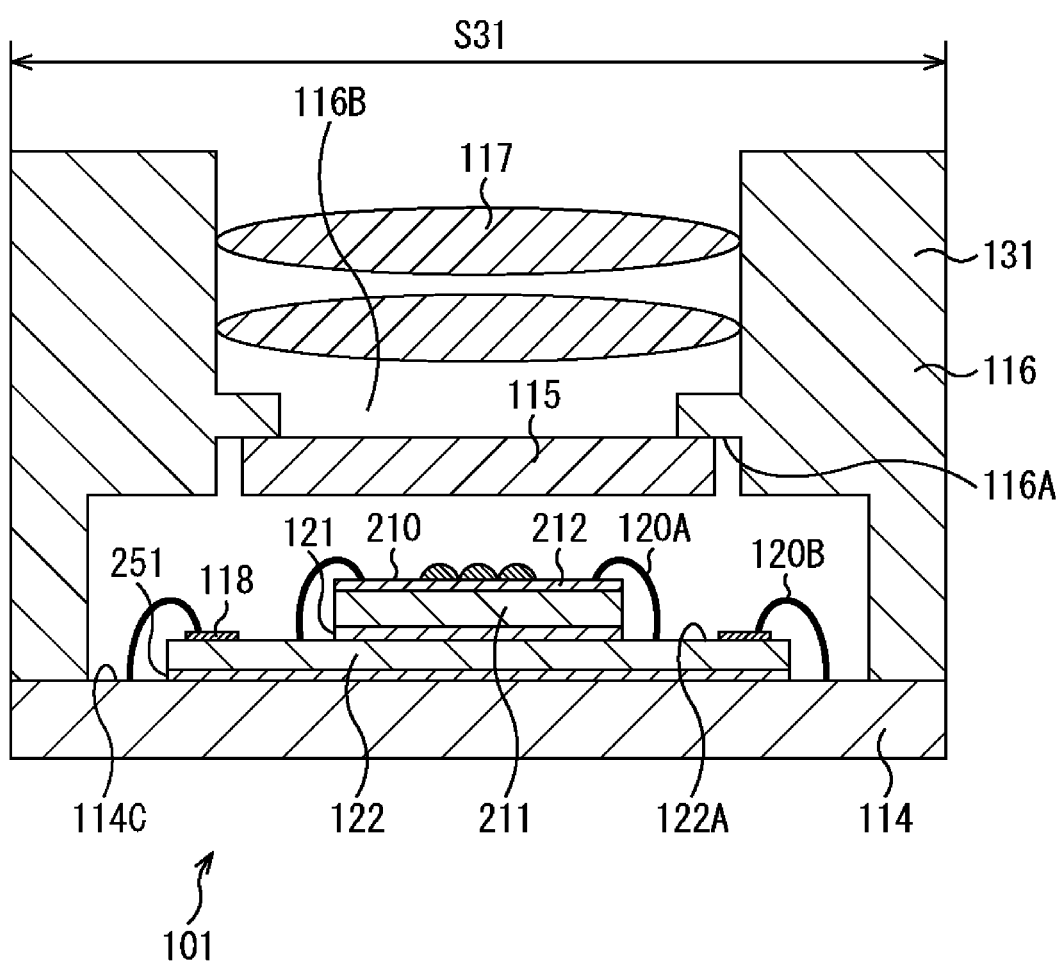
FIG. 15 is a view showing a configuration of a cross section of a further optical module 101 of the present technique.

FIG. 15 is a view showing a configuration of a cross section of a further optical module 101. In this optical module 101, a memory chip 122 to which a sensor 210 is joined through a die bond material 121 is further connected directly to the substrate 114. Further, not only the sensor 210 and the memory chip 122 are connected to each other by wires 120A, but also the memory chip 122 and the substrate 114 are connected to each other by wires 120B.

Accordingly, as shown in FIGS. 3 and 9, the possibility of damage to the memory chip 122 can be reduced further in comparison with an alternative case in which the memory chip 122 and the substrate 114 are connected to each other by the bumps 113.

Since the optical module 101 of FIG. 15 does not utilize the bumps 113 but uses only wire bonding, reduction in cost can be achieved in comparison with the optical modules 101 of FIGS. 3 and 9.

Figure 16:
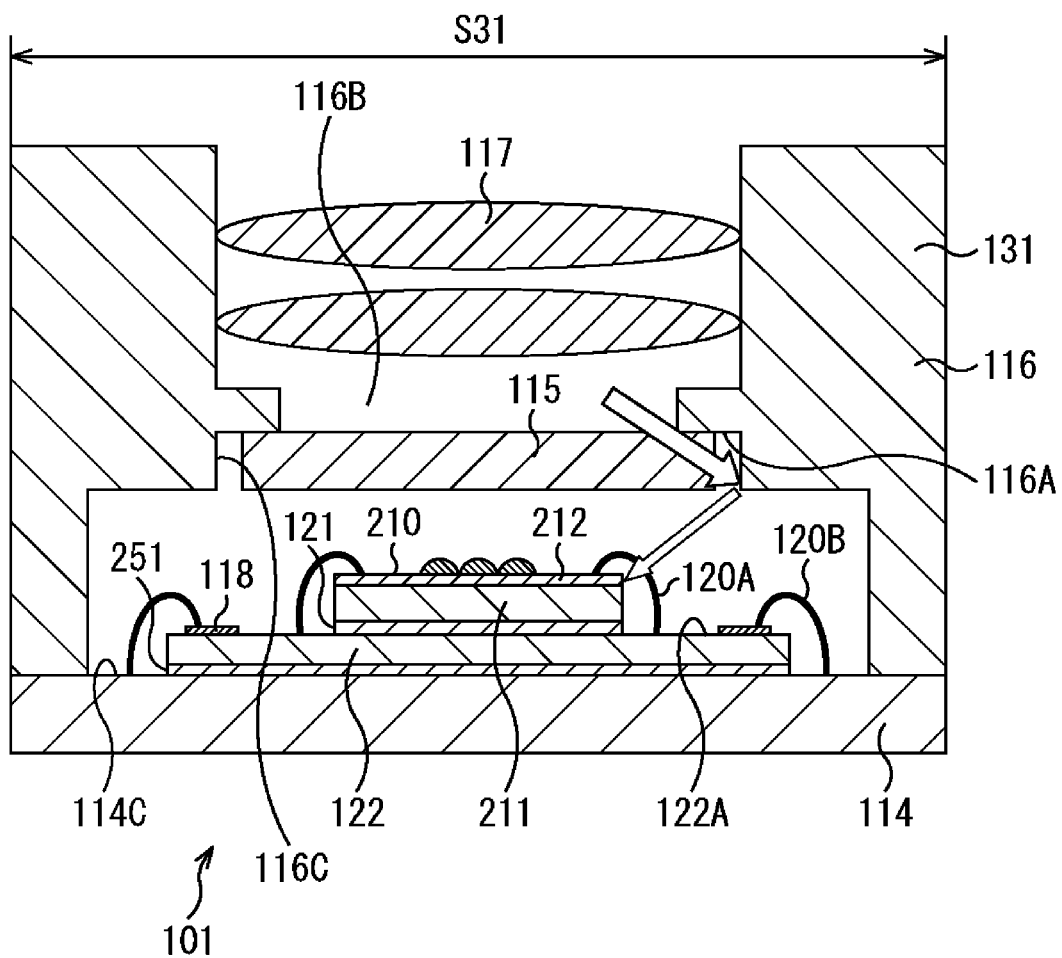
FIG. 16 is a view illustrating a state of reflection of light of the optical module 101 of FIG. 15.

FIG. 16 is a view illustrating a state of reflection of light of the optical module 101 of FIG. 15. As shown in FIG. 16, part of light entering through the lens 117 and the filter 115 is reflected by an end face 116C of the retention member 116, and part of the reflected light advances toward the sensor 210. However, the sensor 210 projects in a direction toward the opening 116B from the upper face 122U of the memory chip 122 (a step is formed between the sensor 210 and the memory chip 122), and the light reception section 212 is positioned higher than the upper face 122U of the memory chip 122. Further, the light reception section 212 is spaced away from the end face 116C by an amount corresponding to the region 122A.

As a result, the amount of the reflected light entering the light reception section 212 decreases in comparison with that in the case of the light reception section 12 of FIG. 2. In particular, in order to prevent light reflected in the optical module 101 from advancing to the light reception section 212, the step by the thickness of the sensor 210 is utilized to cut part of the reflected light by the end face 210A of the sensor 210. Although part of light reflected by the wires 120 enters the light reception section 212, the amount of such light is small. Accordingly, the possibility that a ghost may appear is lower in the case illustrated in FIG. 16 than in the case illustrated in FIG. 2. As a result, restrictions to the design of the retention member 116 are reduced.

Fabrication Process

Figure 17:
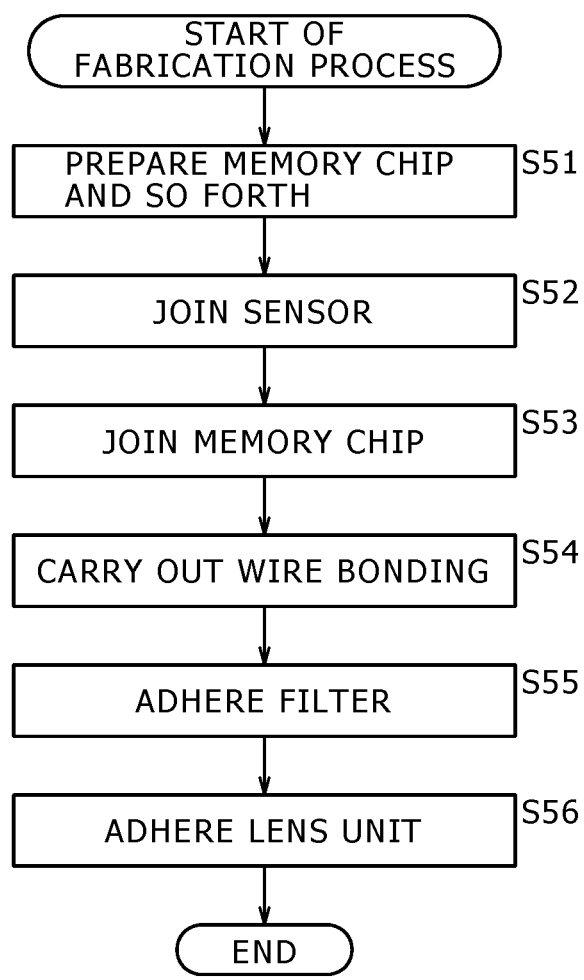
FIG. 17 is a flow chart illustrating a fabrication method for the optical module 101 of FIG. 15.

A fabrication method of the optical module 101 of FIG. 15 is described with reference to FIGS. 17 and 18. FIG. 17 is a flow chart illustrating a fabrication method of the optical module 101 of FIG. 15. FIGS. 18A, 18B, 18C, and 18D are views illustrating a fabrication process of the optical module 101 of FIG. 15. It is to be noted that the fabrication apparatus for the optical module 101 of FIG. 15 is basically similar to that in the case shown in FIG. 5.

At step S51, the preparation section 511 prepares a memory chip 122 and so forth. Naturally, at this time, necessary members other than the memory chip 122 are prepared. For example, also a sensor 210, a substrate 114, a filter 115, a lens unit 131 and so forth are prepared.

Figure 18A:
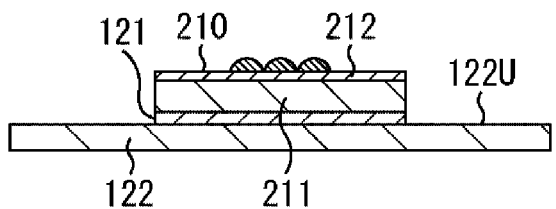
FIGS. 18A, 18B, 18C, and 18D are views illustrating a fabrication process of the optical module 101 of FIG. 15.
Figure 18B:
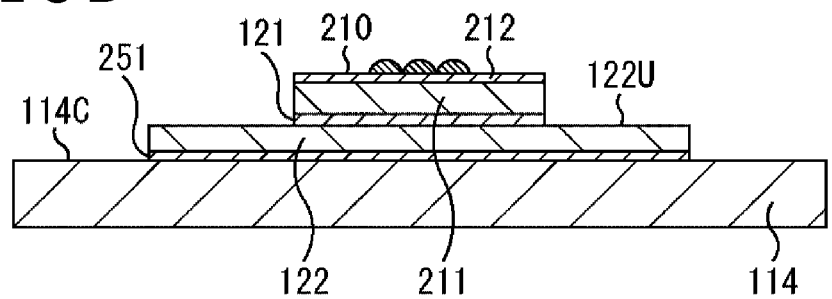

At step S52, the joining section 513 joins the sensor 210. In particular, the sensor 210 is joined directly to the upper face 122U of the memory chip 122 through the die bond material 121 as shown in FIG. 18A.

At step S53, the joining section 513 joins the memory chip 122. In particular, the memory chip 122 to which the sensor 210 is adhered is joined directly to the upper face 114C of the substrate 114 through a die bond material 251.

Figure 18C:
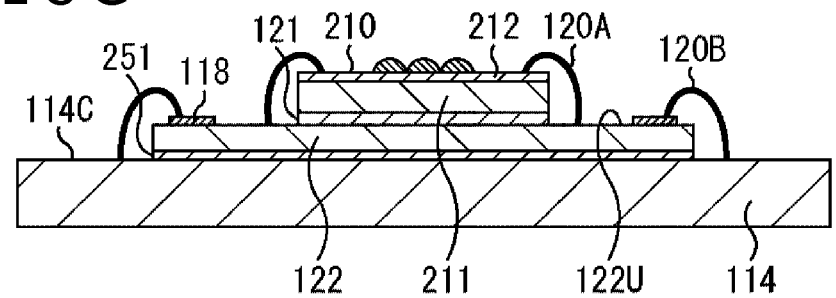

At step S54, the connection section 512 carries out wire bonding. In particular, load and ultrasonic vibration are applied through the capillary 301 so that the wires 120A are connected to a periphery of the light reception section 212 of the sensor 210 and the upper face 122U of the memory chip 122 as shown in FIG. 18C. Further, the sensor 210 and the substrate 114 are connected to each other by the wires 120B.

It is to be noted that, although load and ultrasonic vibration are applied upon connection of the wires 120A and 120B, the process is carried out for one by one of wires 120. As a result, the memory chip 122 is scarcely damaged. While, particularly in the optical modules 101 of FIGS. 3 and 9, the memory chip 122 and the substrate 114 are connected to each other by the bumps 113, in the optical module 101 of FIG. 15, also the memory chip 122 and the substrate 114 are connected to each other by the wires 120. Accordingly, the optical module 101 of FIG. 15 is less likely to be damaged in comparison with the optical modules 101 of FIGS. 3 and 9. However, it is safer if formation of memory cells on the memory chip 122, in which wire bonding is applied, is inhibited and the region 122A is used for formation only of a wiring line layer as a precautionary measure.

Figure 18D:
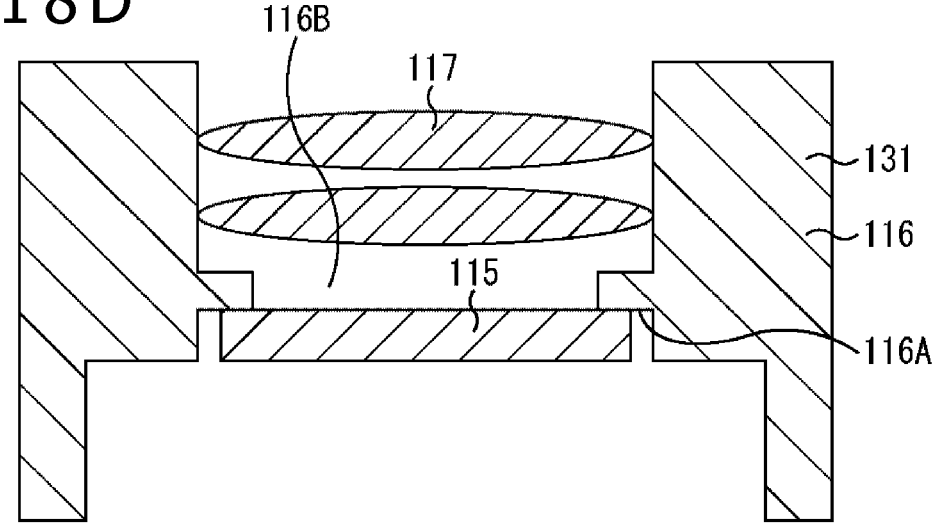

At step S55, the joining section 513 adheres the filter 115. In particular, the filter 115 is adhered to a face 116A of the retention member 116 of the lens unit 131 so as to close up the space 116B of the retention member 116 through which light is to pass as shown in FIG. 18D.

At step S56, the joining section 513 adheres the lens unit 131. In particular, the retention member 116 which retains the lens 117 is adhered at an end portion thereof to the face 114C of the substrate 114 as shown in FIG. 15.

Also in the optical module 101 of FIG. 15, the length of the wires 120 can be reduced in comparison with an alternative case wherein the substrate 14 in the optical module 1 of FIG. 1 is elongated and a memory chip is joined to some place of the extended substrate 14, and high-speed processing can be anticipated. Further, also in the optical module 101 of FIG. 15, effects similar to those achieved by the optical modules 101 of FIGS. 3 and 9 can be achieved.

It is to be noted that the embodiment of the present technology is not limited to the embodiment described hereinabove but various alterations can be made without departing from the subject matter of the present technology.

3. Other Configuration

The present technology can have such configurations as described below.

(1)

An optical module, including:
a sensor configured to pick up an image of an image pickup object; and
a memory chip configured to store pixel data read out from the sensor and having the sensor joined thereto, wherein the chip sizes of the memory chip and the sensor are different from each other and the sensor is placed at an upper portion of the memory chip.

(2)

The optical module according to (1) above, wherein the memory chip is connected to a substrate through a connection portion by flip-chip connection.

(3)

The optical module according to (1) or (2) above, wherein the sensor is connected by a wire to the memory chip to which the sensor is joined.

(4)

The optical module according to any of (1) to (3) above, wherein the sensor is joined to the memory chip so as to project toward an opening of the substrate from the memory chip.

(5)

The optical module according to any of (2) to (4), wherein the connection portion by the flip-chip connection connects a periphery of the memory chip to the substrate.

(6)

The optical module according to any of (3) to (5) above, wherein the wire is connected at one end thereof to a periphery of a face of the sensor on the opening side and at the other end thereof to a region of the memory chip between the connection portion by the flip-chip connection and an end face of the sensor.

(7)

The optical module according to any of (1) to (6) above, wherein the sensor is a stacked sensor.

(8)

The optical module according to any of (2) to (7) above, wherein a retention member which retains a lens for guiding light emerging toward a filter so as to enter the sensor through the filter is joined to a face of the substrate opposing to a face of the memory chip to which the connection portion by the flip-chip connection is connected.

(9)

The optical module according to (1) above, wherein the memory chip is joined, at the face thereof on which the sensor is not placed, to the substrate.

(10)

The optical module according to (9) above, wherein a retention member which retains a lens for guiding light emerging toward a filter so as to enter the sensor through the filter is joined to the face of the substrate to which the memory chip is joined.

(11)
The optical module according to (9) or (10) above, wherein the memory chip is connected, at a face thereof to which the sensor is joined, to the substrate by a wire.

REFERENCE SIGNS LIST

101 Optical module, 110 Sensor, 111 Logic section, 112 Light reception section, 113 Bump, 114 Substrate, 115 Filter, 116 Retention member, 117 Lens, 119 Underfill, 120 Wire, 121 Die bond material, 122 Memory chip, 131 Lens unit

The invention claimed is:
1. An optical module, comprising:
an image sensor configured to receive light from an object, wherein
the image sensor comprises a light reception section and a logic section,
the light reception section is configured to generate pixel data based on the light received from the object,
the logic section comprises circuitry to process the generated pixel data, and
the light reception section is stacked on an upper face side of a center portion of the logic section of the image sensor;
a chip configured to receive the pixel data from the image sensor via first wires, wherein
the image sensor is directly on an upper face of the chip,
a first size of the image sensor is smaller than a second size of the chip in a first direction,
the first direction is perpendicular to a second direction, and
the light enters the image sensor in the second direction;
a substrate configured to receive the pixel data from the chip via one of second wires or bumps, wherein
a lower face of the chip is connected to an upper face of the substrate,
the lower face of the chip is opposite to the upper face of the chip, and
the chip is smaller in size than the substrate;
a lens unit that includes a lens and a lens retention member, wherein
the lens is retained by the lens retention member,
the upper face of the substrate is connected to the lens retention member,
the lens retention member comprises a protrusion that extends to the first direction,
the protrusion comprises an upper face and a lower face, and
the light reception section is spaced apart from an end face of the lens retention member, such that a portion of the light reflected by the end face of the lens retention member reaches an end face of the image sensor that faces the lens retention member; and
a filter connected to the lower face of the protrusion, wherein the filter is configured to filter infrared rays from the light guided towards the light reception section.
2. The optical module according to claim 1, wherein the filter is larger in size than the image sensor.
3. The optical module according to claim 1, wherein the image sensor is connected to a center of the upper face of the chip.
4. The optical module according to claim 1, wherein
the lens is configured to guide the light from the object towards the image sensor, and
the filter is between the lens and the image sensor.
5. The optical module according to claim 1, wherein the image sensor is joined to the chip through a die bond material.
6. The optical module according to claim 1, wherein the chip comprises a memory chip.
7. An optical module, comprising:
an image sensor configured to receive light from an object, wherein
the image sensor comprises a light reception section and a logic section,
the light reception section is configured to generate pixel data based on the light received from the object,
the logic section comprises circuitry to process the generated pixel data, and
the light reception section is stacked on an upper face side of a center portion of the logic section of the image sensor;
a chip configured to receive the pixel data from the image sensor via first wires, wherein
the image sensor is directly on an upper face of the chip,
a first size of the image sensor is smaller than a second size of the chip in a first direction,
the first direction is perpendicular to a second direction, and
the light enters the image sensor in the second direction;
a substrate configured to receive the pixel data from the chip via one of second wires or bumps, wherein
a lower face of the chip is connected to an upper face of the substrate,
the lower face of the chip is opposite to the upper face of the chip, and
the chip is smaller in size than the substrate;
a lens unit that includes a lens and a lens retention member, wherein
the lens is retained by the lens retention member,
the upper face of the substrate is connected to the lens retention member,
the lens retention member comprises a protrusion that extends to the first direction, and
the light reception section is spaced apart from an end face of the lens retention member, such that a portion of the light reflected by the end face of the lens retention member reaches an end face of the image sensor that faces the lens retention member; and
a filter connected to the protrusion in the second direction, wherein the filter is configured to filter infrared rays from the light guided towards the light reception section.
8. The optical module according to claim 7, wherein the filter is larger in size than the image sensor.
9. The optical module according to claim 7, wherein the image sensor is connected to a center of the upper face of the chip.
10. The optical module according to claim 7, wherein
the lens is configured to guide the light from the object towards the image sensor, and
the filter is between the lens and the image sensor.
11. The optical module according to claim 7, wherein the image sensor is joined to the chip through a die bond material.

12. The optical module according to claim 7, wherein the chip comprises a memory chip.

13. The optical module according to claim 1, wherein a back focus of the optical module is based on a thickness of the image sensor and the chip.

\* \* \* \* \*